US006587566B2

(12) United States Patent
Iigai et al.

(10) Patent No.: US 6,587,566 B2
(45) Date of Patent: Jul. 1, 2003

(54) SOUND FIELD FORMING CIRCUIT AND SOUND FIELD FORMING APPARATUS

(75) Inventors: Yukiya Iigai, Saitama (JP); Haruyuki Inohana, Saitama (JP); Akio Ozawa, Saitama (JP); Kazuyuki Kudo, Saitama (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 09/984,556

(22) Filed: Oct. 30, 2001

(65) Prior Publication Data

US 2002/0054687 A1 May 9, 2002

(30) Foreign Application Priority Data

Nov. 6, 2000 (JP) ....................................... 2000-337224

(51) Int. Cl.[7] ............................ H03G 5/00; H02B 1/00

(52) U.S. Cl. ...................... 381/101; 381/123; 333/28 T

(58) Field of Search ................................ 381/101, 102, 381/123, 103; 84/622, 659, 692; 333/28 T, 28 R; 455/267

(56) References Cited

U.S. PATENT DOCUMENTS

| | | | | | |
|---|---|---|---|---|---|
| 4,283,983 | A | * | 8/1981 | Kashio | 84/622 |
| 4,287,804 | A | * | 9/1981 | Hirose | 84/659 |
| 5,138,665 | A | * | 8/1992 | Ito | 381/102 |
| 6,108,428 | A | * | 8/2000 | Suzuki et al. | 381/101 |

* cited by examiner

*Primary Examiner*—Xu Mei
(74) *Attorney, Agent, or Firm*—Morgan, Lewis & Bockius LLP

(57) ABSTRACT

A sound field forming circuit includes a first switch portion which switchingly supplies one of an audio signals from a sound source and a second tone control circuit which variably adjusts a characteristic of a second predetermined frequency band, to a first tone control circuit which variably adjusts a characteristic of a first predetermined frequency band; a second switch portion which switchingly supplies one of the audio signals from the sound source and the first tone control circuit, to the second tone control circuit; a third switch portion which switchingly supplies one of the audio signals from the first tone control circuit and the second tone control circuit, to a front channel; and a fourth switch portion which switchingly supplies one of the audio signals from the first tone control circuit and the second tone control circuit, to a rear channel.

3 Claims, 4 Drawing Sheets

SOUND FIELD FORMING CIRCUIT AND SOUND FIELD FORMING APPARATUS

BACKGROUND OF THE INVENTION

1. Field of the Invention

The present invention relates to a sound field forming circuit including a first tone control circuit which variably adjusts a characteristic of a first predetermined frequency band of an audio signal, a second tone control circuit which variably adjusts a characteristic of a second predetermined frequency band of the audio signal, and first and second channels which output audio signals that are supplied from the first and second tone control circuits, respectively, and also to a sound field forming apparatus including such a sound field forming circuit.

2. Description of the Related Art

For example, a conventional sound field forming circuit which is to be mounted in an audio apparatus or the like is configured as shown in FIG. 6. An audio signal from an audio signal source (such as an AM/FM radio broadcasting, a cassette tape player, a CD (Compact Disc) player, a MD (Mini Disc) player, or a DVD (Digital Video Disc) player) is output to front and rear channels via a first tone control circuit (Tone1) and a second tone control circuit (Tone2). Audio signals from the front channel (ch1) and the rear channel (ch2) are output to respective speakers.

In this configuration, for example, a characteristic (gain) of the high-frequency band can be adjusted by the first tone control circuit, and a characteristic (gain) of the low-frequency band can be adjusted by the second tone control circuit, thereby enabling the listener to listen a desired tone range corresponding to the audio signal source.

However, such a conventional sound field forming circuit has a problem in that, even when characteristics of frequency bands can be adjusted by the first and second tone control circuits, the frequency characteristics of the front and rear channels are identical with each other and hence a deep sound field cannot be formed.

SUMMARY OF THE INVENTION

It is an object of the invention to provide a sound field forming circuit which solves the problem, and which can form a sound field that is deep and full of variety, and a sound field forming apparatus comprising such a sound field forming circuit.

In order to attain the object, the sound field forming circuit according to a first aspect of the invention comprises: a first tone control circuit which variably adjusts a characteristic of a first predetermined frequency band of an audio signal; a second tone control circuit which variably adjusts a characteristic of a second predetermined frequency band of the audio signal; first and second channels which output audio signals that are supplied from the first and second tone control circuits, respectively; a first switch portion which switchingly supplies one of an audio signal from a sound source and the audio signal output from the second tone control circuit, to the first tone control circuit; a second switch portion which switchingly supplies one of the audio signal from the sound source and the audio signal output from the first tone control circuit, to the second tone control circuit; a third switch portion which switchingly supplies one of the audio signal output from the first tone control circuit and the audio signal output from the second tone control circuit, to the first channel; and a fourth switch portion which switchingly supplies one of the audio signal output from the first tone control circuit and the audio signal output from the second tone control circuit, to the second channel.

According to the first aspect of the invention, a connection pattern of the sound field forming circuit is formed in accordance with a combination of switching of the first to fourth switches, and audio signals having a frequency characteristic corresponding to the connection pattern are output. Therefore, the circuit can provide the listener with a sound field that is deep and full of variety.

The sound field forming apparatus according to a second aspect of the invention comprises: a sound field forming circuit according to the first aspect of the invention; and controlling means for switchingly controlling the first, second, third, and fourth switches which are disposed in the sound field forming circuit, thereby forming a connection pattern of the sound field forming circuit.

According to the second aspect of the invention, the controlling means switchingly controls the first, second, third, and fourth switches, so that various connection patterns of the sound field forming circuit can be formed and audio signals having a frequency characteristic corresponding to such a connection pattern can be output. Therefore, the apparatus can provide the listener with a sound field that is deep and full of variety.

The sound field forming apparatus according to a third aspect of the invention is configured so that, in the sound field forming apparatus of the second aspect of the invention, the controlling means switchingly controls the first, second, third, and fourth switches in accordance with a command signal from an operation unit which designates the connection pattern.

According to the third aspect of the invention, the listener can set a connection pattern of the sound field forming circuit which is suitable to the taste of the listener.

DETAILED DESCRIPTION OF THE PREFERRED EMBODIMENTS

Hereinafter, preferred embodiments of the invention will be described with reference to the accompanying drawings.

Figure 1:
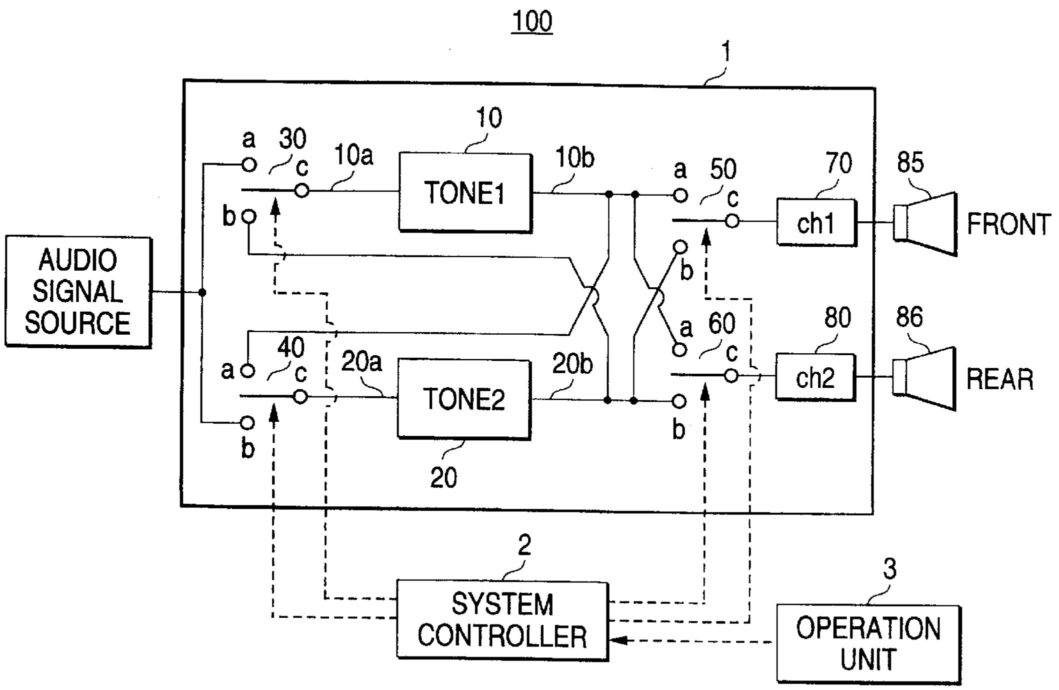
FIG. 1 is a diagram schematically showing the configuration of a sound field forming apparatus of an embodiment.

FIG. 1 is a diagram schematically showing the configuration of a sound field forming apparatus of an embodiment.

As shown in FIG. 1, the sound field forming apparatus 100 includes a sound field forming circuit 1, a system controller 2 serving as controlling means, and an operation unit 3. The sound field forming circuit 1 comprises: a first tone control circuit 10 which adjusts a characteristic of a high frequency band of an audio signal; a second tone control circuit 20 which adjusts a characteristic of a low frequency band of the audio signal; a first switch portion 30; a second switch portion 40; a third switch portion 50; a fourth switch portion 60; a front channel 70 serving as a first channel; and a rear channel 80 serving as a second channel. These components are collected into, for example, an LSI (Large Scale Integration).

In the sound field forming circuit 1, a contact a of the first switch portion 30 is connected to an audio signal source (sound source) such as an AM/FM radio broadcasting, a cassette tape player, a CD player, a MD player, or a DVD player, a contact b is connected to an output portion 20*b* of the second tone control circuit 20, and a movable contact c is connected to an input potion 10*a* of the first tone control circuit 10. In a state where the movable contact c is connected to the contact a, an audio signal from the audio signal source is supplied to the first tone control circuit 10. By contrast, in a state where the movable contact c is connected to the contact b, an audio signal output from the second tone control circuit 20 is supplied to the first tone control circuit 10.

A contact a of the second switch portion 40 is connected to an output portion 10*b* of the first tone control circuit 10, a contact b is connected to the audio signal source, and a movable contact c is connected to an input potion 20*a* of the second tone control circuit 20. In a state where the movable contact c is connected to the contact a, an audio signal output from the first tone control circuit 10 is supplied to the second tone control circuit 20. By contrast, in a state where the movable contact c is connected to the contact b, the audio signal from the audio signal source is supplied to the second tone control circuit 20.

A contact a of the third switch portion 50 is connected to the output portion 10*b* of the first tone control circuit 10, a contact b is connected to the output portion 20*b* of the second tone control circuit 20, and a movable contact c is connected to the front channel 70. In a state where the movable contact c is connected to the contact a, the audio signal output from the first tone control circuit 10 is supplied to the front channel 70. By contrast, in a state where the movable contact c is connected to the contact b, the audio signal output from the second tone control circuit 20 is supplied to the front channel 70.

A contact a of the fourth switch portion 60 is connected to the output portion 10*b* of the first tone control circuit 10, a contact b is connected to the output portion 20*b* of the second tone control circuit 20, and a movable contact c is connected to the rear channel 80. In a state where the movable contact c is connected to the contact a, the audio signal output from the first tone control circuit 10 is supplied to the rear channel 80. By contrast, in a state where the movable contact c is connected to the contact b, the audio signal output from the second tone control circuit 20 is supplied to the rear channel 80.

The front channel 70 is connected to a front speaker 85. The front speaker 85 plays back the audio signal output from the front channel 70. The rear channel 80 is connected to a rear speaker 86. The rear speaker 86 plays back the audio signal output from the rear channel 80.

The system controller 2 is configured by a CPU (Central Processing Unit), and performs a switching control on the first switch 30, the second switch 40, the third switch 50, and the fourth switch 60 in the sound field forming circuit 1 (a switching control of the contacts of the switches 30 to 60) to form a connection pattern of the sound field forming circuit 1. This switching control is performed in accordance with a connection pattern command signal which is output from the operation unit 3 to designate the connection pattern.

In accordance with a characteristic adjust signal which is output from the operation unit 3 to adjust a characteristic (gain) of the high frequency band, the system controller 2 gives the first tone control circuit 10 a command to set the characteristic (gain) of the frequency band. Furthermore, in accordance with a characteristic adjust signal which is output from the operation unit 3 to adjust a characteristic (gain) of the low frequency band, the system controller 2 gives the second tone control circuit 20 a command to set the characteristic (gain) of the frequency band.

Figure 2:
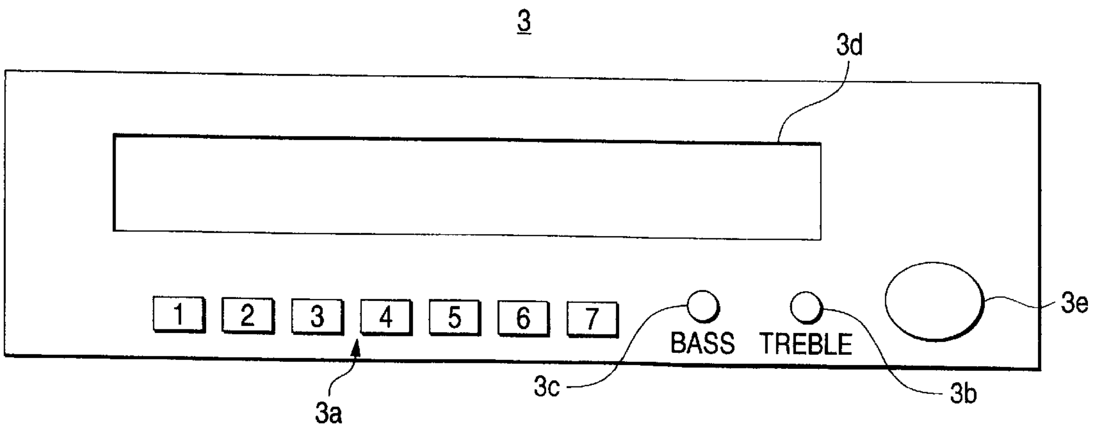
FIG. 2 is a view showing an example of the appearance of an operation unit.

FIG. 2 is a view showing an example of the appearance of the operation unit 3. As shown in FIG. 2, in the operation unit 3, disposed are: buttons 3*a* for designating the connection pattern of the sound field forming circuit 1 (hereinafter, referred to as "connection pattern designating buttons 3*a*"); a volume 3*b* for adjusting the characteristic (gain) of the high frequency band (hereinafter, referred to as "treble volume 3*b*"); a volume 3*c* for adjusting the characteristic (gain) of the low frequency band (hereinafter, referred to as "bass volume 3*c*"); a display portion 3*d* for displaying a track number of a CD, etc.; a sound volume 3*e* for adjusting the sound level; and the like. In the example of FIG. 2, seven connection pattern designating buttons 3*a* are used in total, and connection patterns of the sound field forming circuit 1 which can be designated by the buttons 3*a* are different from one another. Namely, the sound field forming circuit 1 can form seven connection patterns. When one of the connection pattern designating buttons 3*a* is depressed, a connection pattern command signal corresponding to the depressed button is output from the operation unit 3 to the system controller 2.

When the treble volume 3*b* or the bass volume 3*c* is operated, a characteristic adjust signal corresponding to the operation is output from the operation unit 3 to the system controller 2.

In the above configuration, when one of the connection pattern designating buttons 3*a* of the operation unit 3 is depressed by the listener, a connection pattern command signal corresponding to the depressed button 3*a* is output from the operation unit 3 to the system controller 2. In accordance with the connection pattern command signal, the system controller 2 performs a switching control on the first switch 30, the second switch 40, the third switch 50, and the fourth switch 60, whereby the connection pattern of the sound field forming circuit 1 is formed. When the connection pattern is formed in this way, audio signals each having a frequency characteristic corresponding to the connection pattern are supplied to the front channel 70 and the rear channel 80, respectively.

Figure 3:
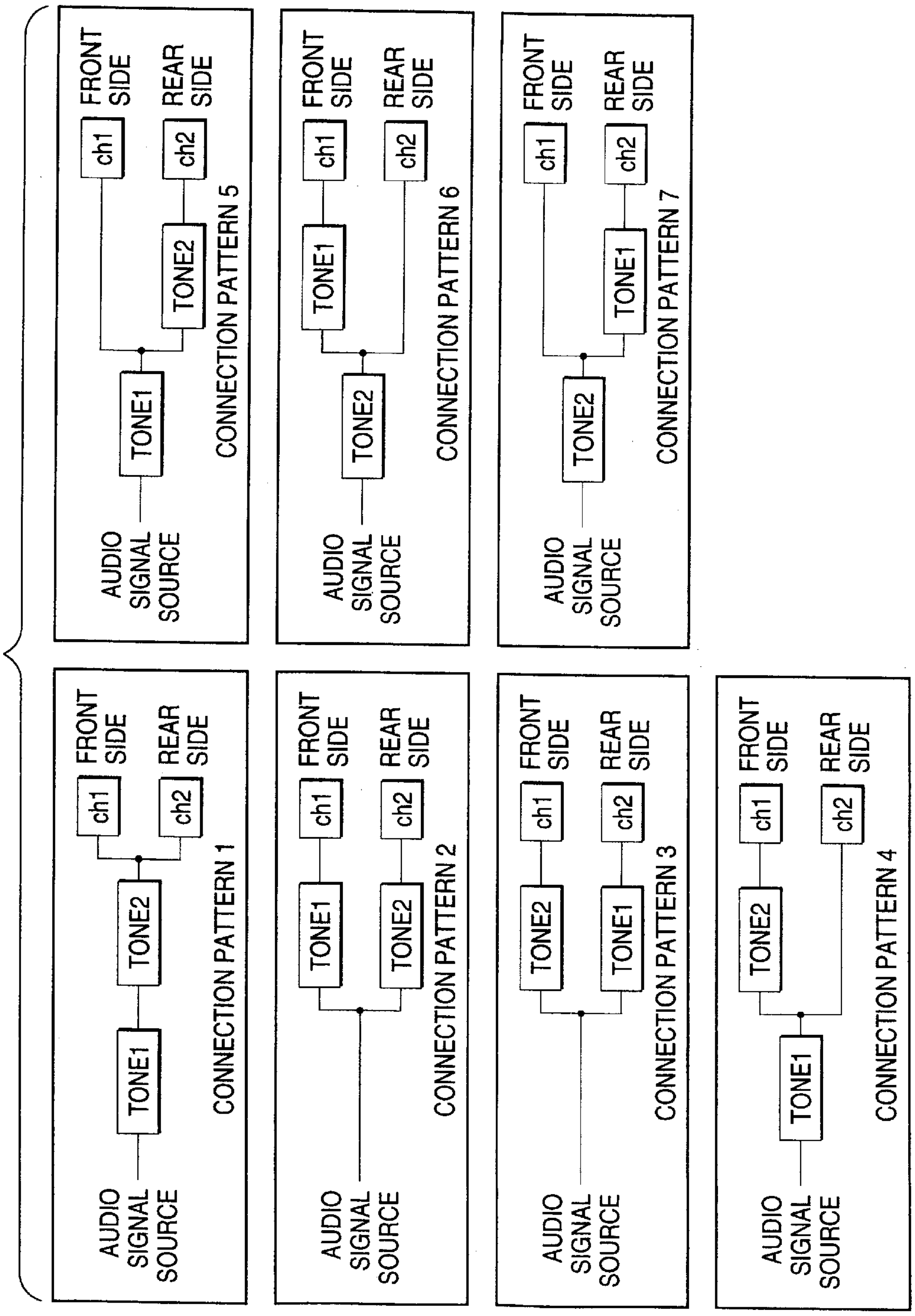
FIG. 3 is a diagram showing examples of a connection pattern of a sound field forming circuit.
Figure 4:
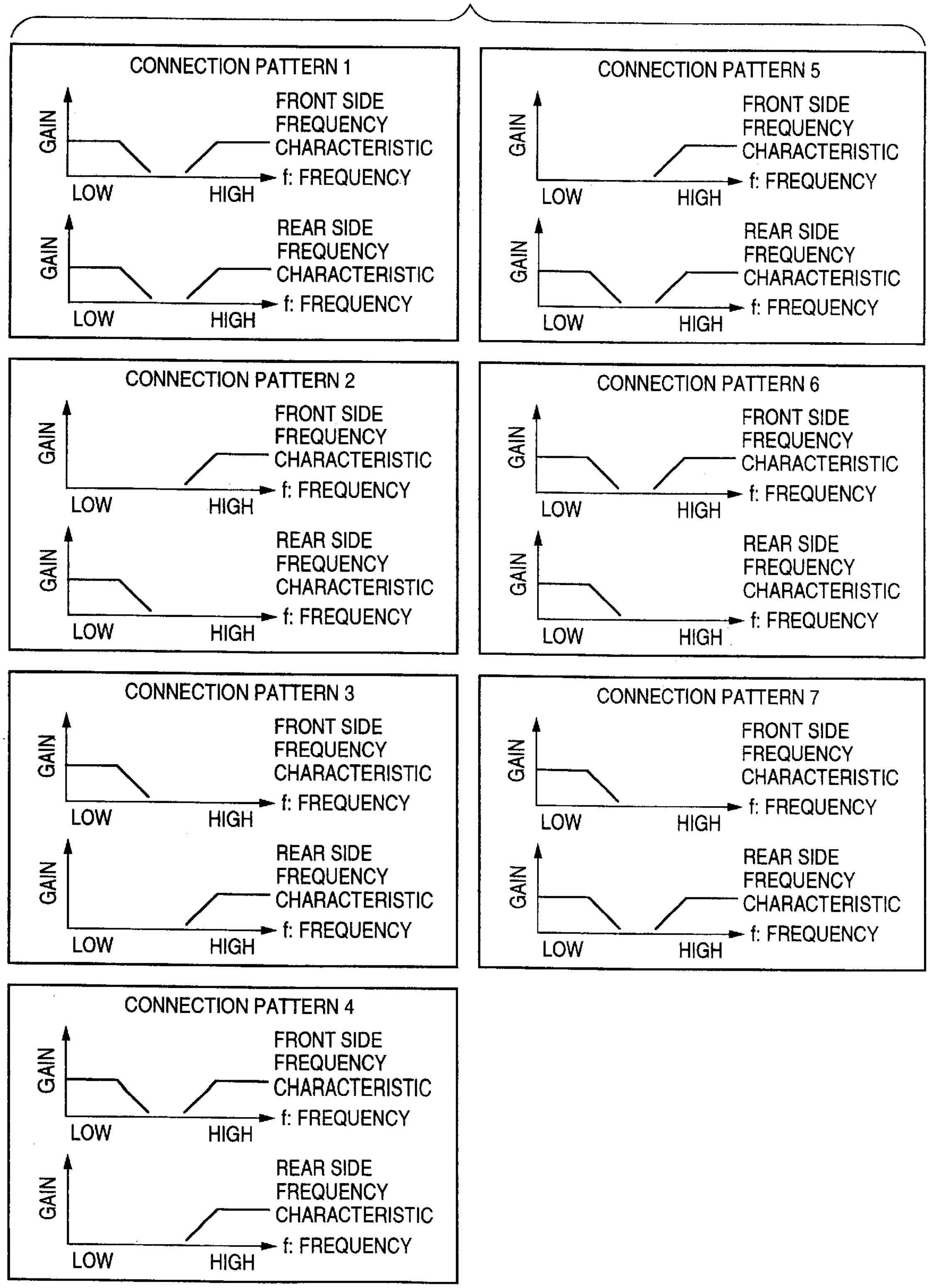
FIG. 4 is a diagram showing frequency characteristics of audio signals in a front channel and a rear channel in the connection patterns shown in FIG. 3.

FIG. 3 is a diagram showing examples of the connection pattern of the sound field forming circuit 1, and FIG. 4 is a diagram showing frequency characteristics of audio signals in the front channel 70 (FRONT side) and the rear channel 80 (REAR side) in the connection patterns shown in FIG. 3. In connection 1 shown in FIG. 3, as shown in FIG. 4, each of the front channel 70 and the rear channel 80 has a frequency characteristic in which the gains in the low and high frequency bands are high. By contrast, in connection 2 shown in FIG. 3, as shown in FIG. 4, the front channel 70 has a frequency characteristic in which the gain in the low frequency band is low and that in the high frequency band is high, and the rear channel 80 has a frequency characteristic in which the gain in the low frequency band is high and that in the high frequency band is low. In connection patterns 3 to 7 also, the front channel 70 and the rear channel 80 have respective unique frequency characteristics.

As described above, in the sound field forming apparatus 100 of the embodiment, the connection pattern of the sound field forming circuit 1 can be arbitrary set to the one which is suitable to the taste of the listener, by switching the switches 30 to 60, so that audio signals having a frequency characteristic peculiar to the connection pattern can be output. Therefore, the listener can be provided with a sound field that is deep and full of variety.

Figure 5:
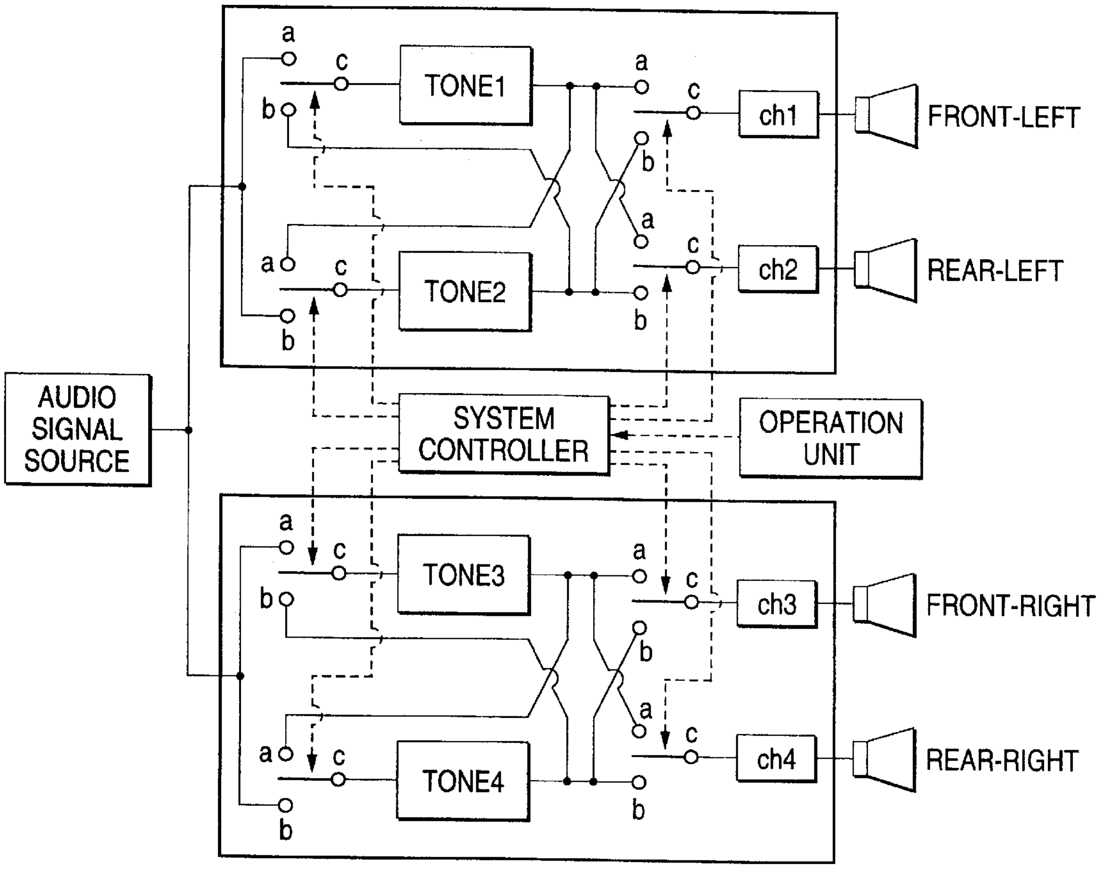
FIG. 5 is a diagram showing another example of the sound field forming apparatus in which two sound field forming circuits are disposed.
Figure 6:
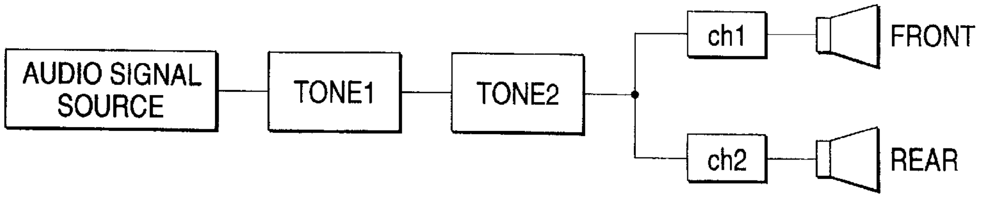
FIG. 6 is a diagram showing a conventional sound field forming circuit.

In the above embodiment, the case where a single sound field forming circuit (two channels) is applied has been described. The invention is not restricted to this. As shown in FIG. 5, for example, two sound field forming circuits 1 may be disposed, and speakers (for example, a front-left speaker, a rear-left speaker, a front-right speaker, and a rear-right speaker) may be connected to the four channels, respectively. According to this configuration, a sound field that is more full of variety can be provided in front, rear, right, and left of the speakers.

The above-described sound field forming apparatus can be applied to audio systems such as a home audio system, a business audio system, and a vehicle audio system, and various apparatuses which can reproduce an audio signal.

As described above, the invention is configured so that various connection patterns of a sound field forming circuit can be arbitrarily set, and audio signals having a frequency characteristic peculiar to the connection pattern can be output. Therefore, the listener can be provided with a sound field that is deep and full of variety.

What is claimed is:

1. A sound field forming circuit comprising:

a first tone control circuit which variably adjusts a characteristic of a first predetermined frequency band of an audio signal;

a second tone control circuit which variably adjusts a characteristic of a second predetermined frequency band of the audio signal;

first and second channels which output audio signals that are supplied from the first and second tone control circuits, respectively;

a first switch portion which switchingly supplies one of an audio signal from a sound source and the audio signal output from the second tone control circuit, to the first tone control circuit;

a second switch portion which switchingly supplies one of the audio signal from the sound source and the audio signal output from the first tone control circuit, to the second tone control circuit;

a third switch portion which switchingly supplies one of the audio signal output from the first tone control circuit and the audio signal output from the second tone control circuit, to the first channel; and a fourth switch portion which switchingly supplies one of the audio signal output from the first tone control circuit and the audio signal output from the second tone control circuit, to the second channel.

2. A sound field forming apparatus according to claim 1, further comprising: a controller for switchingly controlling the first, second, third, and fourth switches which are disposed in the sound field forming circuit, thereby forming a connection pattern of the sound field forming circuit.

3. The sound field forming apparatus according to claim 2, wherein said controller switchingly controls the first, second, third, and fourth switches in accordance with a command signal from an operation unit which designates the connection pattern.

* * * * *